(12) United States Patent
Hoang

(10) Patent No.: US 8,559,582 B2
(45) Date of Patent: Oct. 15, 2013

(54) TECHNIQUES FOR VARYING A PERIODIC SIGNAL BASED ON CHANGES IN A DATA RATE

(75) Inventor: Tim Tri Hoang, San Jose, CA (US)

(73) Assignee: Altera Corporation, San Jose, CA (US)

(*) Notice: Subject to any disclaimer, the term of this patent is extended or adjusted under 35 U.S.C. 154(b) by 377 days.

(21) Appl. No.: 12/881,160

(22) Filed: Sep. 13, 2010

(65) Prior Publication Data

US 2012/0063556 A1    Mar. 15, 2012

(51) Int. Cl.
*H04L 7/033* (2006.01)

(52) U.S. Cl.
USPC .......................................... 375/376; 375/373

(58) Field of Classification Search
USPC .................................................. 375/376
See application file for complete search history.

(56) References Cited

U.S. PATENT DOCUMENTS

| | | | | |
|---|---|---|---|---|
| 3,164,777 | A * | 1/1965 | Guanella | 327/40 |
| 4,290,029 | A * | 9/1981 | Streckenbach | 331/1 A |
| 4,516,083 | A * | 5/1985 | Turney | 331/1 A |
| 6,026,134 | A | 2/2000 | Duffy et al. | |
| 6,211,741 | B1 * | 4/2001 | Dalmia | 331/11 |
| 6,411,144 | B1 * | 6/2002 | Matsuno | 327/157 |
| 6,442,271 | B1 | 8/2002 | Tuttle et al. | |
| 6,650,140 | B2 * | 11/2003 | Lee et al. | 326/39 |
| 6,683,930 | B1 | 1/2004 | Dalmia | |
| 7,109,764 | B2 * | 9/2006 | Sakamoto et al. | 327/156 |
| 7,142,013 | B2 * | 11/2006 | Yin | 326/54 |
| 7,342,426 | B2 * | 3/2008 | Kurd et al. | 327/156 |
| 7,352,835 | B1 * | 4/2008 | Asaduzzaman et al. | 375/359 |
| 7,495,517 | B1 * | 2/2009 | Hoang et al. | 331/16 |
| 7,532,697 | B1 * | 5/2009 | Sidiropoulos et al. | 375/376 |
| 7,555,087 | B1 | 6/2009 | Asaduzzaman et al. | |
| 7,590,207 | B1 * | 9/2009 | Shumarayev et al. | 375/354 |
| 7,602,255 | B1 * | 10/2009 | Lai et al. | 331/16 |
| 7,742,553 | B1 * | 6/2010 | Bataineh et al. | 375/376 |
| 7,760,836 | B2 * | 7/2010 | Haas et al. | 375/367 |
| 7,764,759 | B2 * | 7/2010 | Gupta et al. | 375/355 |
| 7,804,367 | B2 * | 9/2010 | Lee et al. | 331/16 |
| 7,821,343 | B1 * | 10/2010 | Wong et al. | 331/2 |

(Continued)

FOREIGN PATENT DOCUMENTS

JP    2785785    5/1998

OTHER PUBLICATIONS

Korean Intellectual Property Office, International Search Report and Written Opinion of the International Searching Authority, International Application PCT/US2011/050441, Feb. 17, 2012, pp. 1-10.

*Primary Examiner* — Chieh M Fan
*Assistant Examiner* — Santiago Garcia
(74) *Attorney, Agent, or Firm* — Steven J. Cahill

(57) ABSTRACT

A circuit includes a phase detection circuit, a phase adjustment circuit, and a sampler circuit. The phase detection circuit compares a phase of a first periodic signal to a phase of a second periodic signal to generate a control signal. The phase adjustment circuit causes the phase of the second periodic signal and a phase of a third periodic signal to vary based on a variation in the control signal. The sampler circuit samples a data signal to generate a sampled data signal in response to the third periodic signal. The circuit varies a frequency of the third periodic signal to correspond to changes in a data rate of the data signal between at least three different data rates that are based on at least three data transmission protocols.

30 Claims, 8 Drawing Sheets

(56) References Cited

U.S. PATENT DOCUMENTS

| | | | |
|---|---|---|---|
| 7,953,162 B2* | 5/2011 | Shetty | 375/257 |
| 8,000,412 B1* | 8/2011 | Loinaz | 375/330 |
| 8,126,079 B1* | 2/2012 | Tran et al. | 375/295 |
| 8,170,169 B2* | 5/2012 | Martin et al. | 375/373 |
| 2002/0075080 A1* | 6/2002 | Nelson et al. | 331/11 |
| 2005/0058222 A1* | 3/2005 | Black et al. | 375/316 |
| 2005/0099235 A1* | 5/2005 | Sakamoto et al. | 331/16 |
| 2005/0110537 A1* | 5/2005 | Wurzer | 327/156 |
| 2006/0062339 A1* | 3/2006 | Briones | 375/375 |
| 2006/0119437 A1* | 6/2006 | Thomsen et al. | 331/10 |
| 2006/0164174 A1* | 7/2006 | Molina et al. | 331/16 |
| 2007/0046388 A1* | 3/2007 | Sanders | 331/179 |
| 2008/0112525 A1* | 5/2008 | Do et al. | 375/376 |
| 2009/0122939 A1* | 5/2009 | Hoang et al. | 375/375 |
| 2011/0188621 A1* | 8/2011 | Asaduzzaman et al. | 375/374 |
| 2012/0224621 A1* | 9/2012 | Stojanovic et al. | 375/233 |

\* cited by examiner

US 8,559,582 B2

TECHNIQUES FOR VARYING A PERIODIC SIGNAL BASED ON CHANGES IN A DATA RATE

BACKGROUND

The present invention relates to electronic circuits, and more particularly, to techniques for varying a periodic signal based on changes in a data rate.

A high-speed digital data stream can be transmitted through a transmission line to a receiver without an accompanying clock signal. A clock and data recovery (CDR) circuit in the receiver generates one or more clock signals from an approximate frequency reference signal, and then phase-aligns the clock signals to the transitions in the data stream. The receiver uses the clock signals to sample bits in the data stream.

Peripheral Component Interconnect Express (PCI-E) is a computer expansion card standard for personal computers. PCI-E 1.0 supports a data rate of 2.5 gigabits per second (Gbps). PCI-E 2.0 supports a data rate of 5 Gbps. The data rate of a data signal indicates a number of bit periods in the data signal per unit of time. A transmitter initially begins transmitting a data signal to a receiver at the PCI-E 1.0 data rate of 2.5 Gbps. Subsequently, the transmitter and receiver attempt to increase the data rate to 5 Gbps based on the PCI-E 2.0 standard to reduce power consumption and to increase the performance of the transmission system. The CDR circuit in the receiver provides a corresponding increase in the frequencies of the clock signals based on the increase in the data rate.

FIG. 1 illustrates an example of a prior art clock and data recovery (CDR) circuit 100 that can adjust the frequencies of clock signals in response to a change in the data rate of a received data signal. CDR circuit 100 includes a phase frequency detector (PFD) circuit 101, multiplexer circuits 102, charge pump circuit 104, low pass filter (LPF) circuit 105, voltage-controlled oscillator (VCO) circuit 106, L counter circuit 107, M counter circuit 108, counter circuit 109, multiplexer circuits 110, phase detector (PD) circuit 111, N counter circuit 112, and lock detector circuit 114.

N counter circuit 112 divides the frequency of a reference clock signal REFCLK to generate a periodic frequency divided clock signal RCKD. Clock signal RCKD is provided to an input of phase frequency detector circuit 101. A clock signal can be any type of periodic signal.

Phase frequency detector (PFD) 101 compares the phase and the frequency of clock signal RCKD to the phase and the frequency of a periodic feedback clock signal FBCLK to generate error signals UPPF and DNPF. Error signals UPPF and DNPF are indicative of the differences between the phases and the frequencies of clock signals RCKD and FBCLK. Multiplexers 102 include two 2-to-1 multiplexers. Initially, multiplexers 102 are configured to provide error signals UPPF and DNPF to charge pump 104 as error signals UP and DN, respectively.

Charge pump 104 converts the UP and DN error signals into an analog control voltage $V_{CL}$. The control voltage $V_{CL}$ is provided to a control input of VCO 106. Low pass filter 105 attenuates high frequency components of the control voltage $V_{CL}$.

VCO 106 generates 4 periodic output clock signals VCO[3:0]. VCO 106 adjusts the phases and frequencies of clock signals VCO[3:0] in response to changes in control voltage $V_{CL}$. The output clock signals VCO[3:0] are transmitted to inputs of L counter circuit 107. L counter circuit 107 divides the frequencies of clock signals VCO[3:0] by a frequency division value to generate 4 periodic clock signals CLKL[3:0]. The frequency division value of L counter circuit 107 is set to divide by 1, 2, 4 or 8. M counter circuit 108 divides the frequency of one of clock signals CLKL[3:0] by a frequency division value to generate feedback clock signal FBCLK. The frequency division value of M counter circuit 108 is set to divide by 1, 4, 5, 8, 10, 16, 20, or 25.

PFD 101, multiplexers 102, charge pump 104, low pass filter 105, VCO 106, and counters 107-108 form a phase-locked loop (PLL) that adjusts the phase and frequency of clock signal FBCLK to cause the phase and frequency of FBCLK to match the phase and frequency of clock signal RCKD. Lock detector circuit 114 asserts the Lock signal in response to error signals UPPF and DNPF indicating that clock signals RCKD and FBCLK are aligned in phase and have the same frequency in a lock state.

The clock signals CLKL[3:0] generated by L counter 107 are provided to inputs of multiplexers 110 and to inputs of counter circuit 109. Counter circuit 109 divides the frequencies of clock signals CLKL[3:0] by 2 to generate the frequencies of 4 periodic clock signals CLKC[3:0] at additional inputs of multiplexers 110. Multiplexers 110 are initially configured to provide the output clock signals CLKC[3:0] of counter 109 to inputs of PD 111 as 4 periodic feedback clock signals CLKOUT[3:0].

Phase detector (PD) 111 compares the phase of the differential input data signal DXP/DXN to the phases of feedback clock signals CLKOUT[3:0]. The 4 clock signals CLKOUT[3:0] have relative phases of 0°, 90°, 180°, and 270°. PD 111 generates error signals UPPD and DNPD that are indicative of the differences between the phase of the differential input data signal DXP/DXN and the phases of clock signals CLKOUT[3:0].

Error signals UPPD and DNPD are transmitted to inputs of multiplexers 102. After the Lock signal has been asserted, multiplexers 102 are reconfigured to provide the output error signals UPPD and DNPD of phase detector 111 to charge pump 104 as error signals UP and DN, respectively. CDR circuit 100 then adjusts the phases of feedback clock signals CLKOUT[3:0] in response to changes in the phase of input data signal DXP/DXN.

The data rate of the input data signal DXP/DXN doubles when changing from PCI-E 1.0 to PCI-E 2.0. Multiplexers 110 are then reconfigured by a control signal SW to provide clock signals CLKL[3:0] to inputs of PD 111 as the 4 feedback clock signals CLKOUT[3:0]. As a result, the frequencies of clock signals CLKOUT[3:0] increase to 2 times their initial frequencies, but the frequencies of the output clock signals VCO[3:0] of VCO 106 remain the same. The PLL in CDR circuit 100 remains in the lock state after the data rate of the input data signal DXP/DXN doubles. Clock signals CLKOUT[3:0] are also provided to a deserializer circuit.

BRIEF SUMMARY

According to some embodiments, a circuit includes a phase detection circuit, a phase adjustment circuit, and a sampler circuit. The phase detection circuit compares a phase of a first periodic signal to a phase of a second periodic signal to generate a control signal. The phase adjustment circuit causes the phase of the second periodic signal and a phase of a third periodic signal to vary based on a variation in the control signal. The sampler circuit samples a data signal to generate a sampled data signal in response to the third periodic signal. The circuit varies a frequency of the third periodic signal to correspond to changes in a data rate of the data signal between at least three different data rates that are based on at least three data transmission protocols.

DETAILED DESCRIPTION

The third generation Peripheral Component Interconnect Express (PCI-E) 3.0 standard supports a data rate of 8 gigabits per second (Gbps). The PCI-E 1.0, PCI-E 2.0, and PCI-E 3.0 standards are three data transmission protocols that support three different data rates. Initially, a transmitter begins transmitting data to a receiver at the PCI-E 1.0 data rate of 2.5 Gbps, as described above. Then, the transmitter attempts to increase the data rate to 5 Gbps based on PCI-E 2.0 or to 8 Gbps based on PCI-E 3.0 to reduce power consumption and to increase the performance of the transmission system. However, the prior art clock and data recovery (CDR) circuit 100 shown in FIG. 1 in the receiver does not have the capability to provide a corresponding increase in the frequencies of the clock signals CLKOUT[3:0] based on an increase in the data rate to 8 Gbps.

The 8 Gbps data rate supported by PCI-E 3.0 is not a multiple of the 2.5 Gbps data rate supported by PCI-E 1.0. The frequency division value of M counter 108 could be changed (e.g., from 25 to 40) to support an increase in the data rate of the differential input data signal DXP/DXN from 2.5 Gbps or 5 Gbps to 8 Gbps. However, when the frequency division value of M counter 108 is changed, the phase-locked loop (PLL) in CDR circuit 100 exits the lock state. After the PLL in CDR circuit 100 exits the lock state, the phases of clock signals RCKD and FBCLK are no longer aligned, and/or clock signals RCKD and FBCLK no longer have the same frequencies.

After exiting the lock state, the PLL in CDR circuit 100 attempts return to the lock state by adjusting the phases and frequencies of clock signals VCO[3:0] and FBCLK. The adjustments to the frequencies of VCO[3:0] cause changes in the frequencies of output clock signals CLKOUT[3:0]. Changes in the frequencies of the output clock signals CLKOUT[3:0] may cause errors in the deserializer or other circuitry that receives output clock signals CLKOUT[3:0].

Figure 2A:
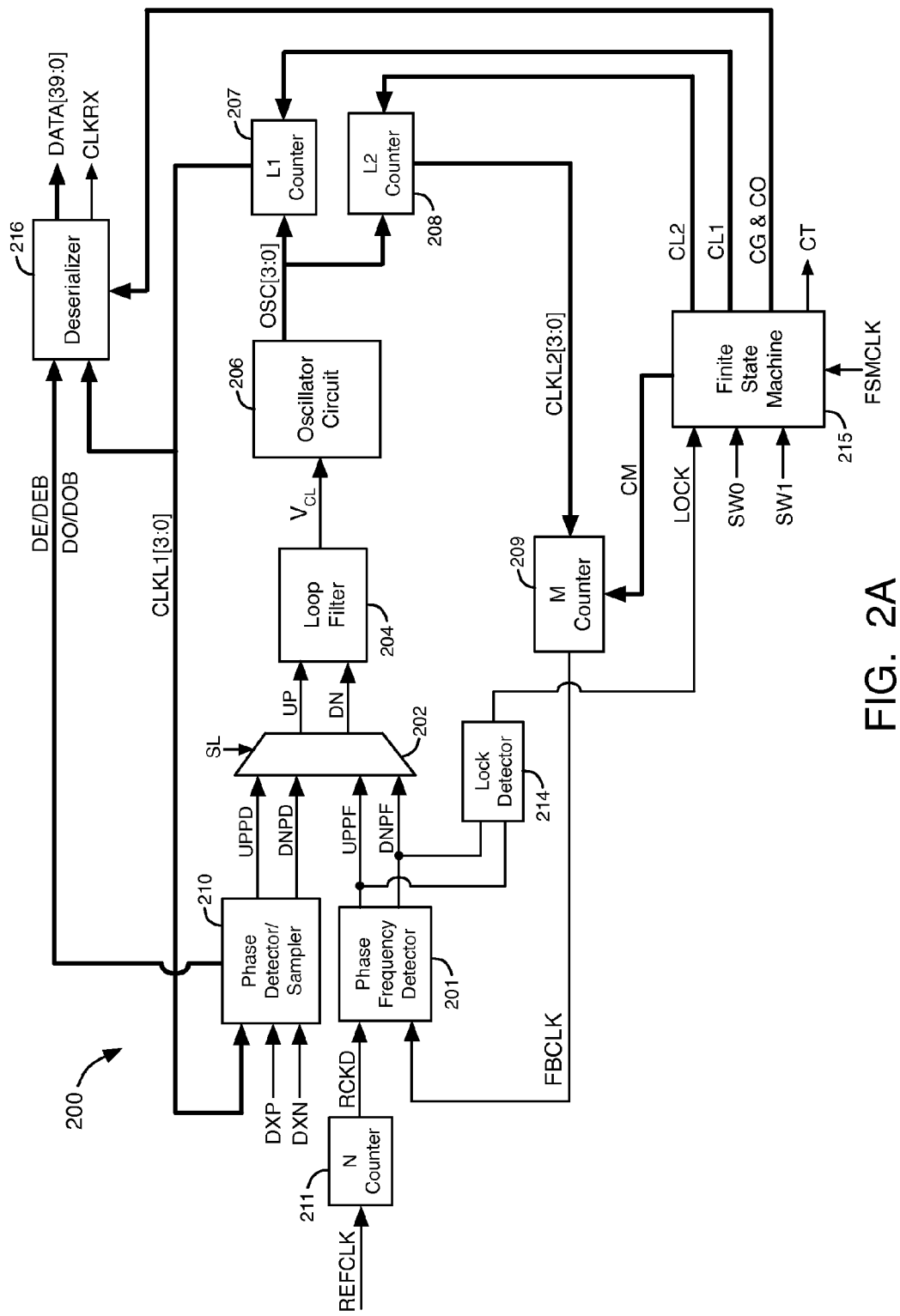
FIG. 2A illustrates an example of a clock and data recovery (CDR) circuit, according to an embodiment of the present invention.

FIG. 2A illustrates an example of a clock and data recovery (CDR) circuit 200, according to an embodiment of the present invention. CDR circuit 200 generates periodic output clock signals CLKL1[3:0] that are based on the bit periods in a differential input data signal DXP/DXN. The output clock signals CLKL1[3:0] of CDR circuit 200 are used to sample the input data signal DXP/DXN. CDR circuit 200 can change the frequencies of its output clock signals CLKL1[3:0] to correspond to changes in the data rate of the input data signal DXP/DXN between three different data rates that are based on three different data transmission protocols.

As an example, CDR circuit 200 can generate three different frequencies of the output clock signals CLKL1[3:0]. The three different frequencies of the output clock signals CLKL1[3:0] are used to sample data in the differential input data signal DXP/DXN at three different data rates. For example, the three different frequencies of the output clock signals CLKL1[3:0] can be used to sample data in the input data signal DXP/DXN at data rates of 2.5 Gbps, 5 Gbps, and 8 Gbps according to the PCI-E 1.0, 2.0, and 3.0 standards, respectively. When the data rate of the input data signal DXP/DXN changes from one of the three PCI-E standards to another one of the three PCI-E standards, CDR circuit 200 changes the frequencies of the output clock signals CLKL1[3:0] to frequencies that can be used to sample the input data signal DXP/DXN at the new data rate. In an embodiment, CDR circuit 200 can generate three or more different frequencies of the output clock signals CLKL1[3:0] that are used to sample data in the input data signal DXP/DXN at three or more different data rates according to three or more data transmission protocols. The data transmission protocols can be PCI-E protocols or any other standard of data transmission protocols.

The clock and data recovery (CDR) circuit 200 includes phase frequency detector (PFD) circuit 201, multiplexer circuits 202, loop filter circuit 204, oscillator circuit 206, L1 counter circuit 207, L2 counter circuit 208, M counter circuit 209, phase detector (PD) and sampler circuit 210, N counter circuit 211, lock detector circuit 214, and finite state machine (FSM) 215. A deserializer circuit 216 is also shown in FIG. 2A. Oscillator circuit 206 can be, for example, a voltage-controlled oscillator circuit, a current-controlled oscillator circuit, or a digitally-controlled oscillator circuit. Oscillator circuit 206 can be, for example, a ring oscillator, an inductor-capacitor tank oscillator, a crystal oscillator, or another type of oscillator. According to alternative embodiments, oscillator circuit 206 is replaced with another type of phase adjustment circuit and/or frequency adjustment circuit that adjusts phases and/or frequencies of periodic output clock signals based on changes in an input control signal.

CDR circuit 200 includes 2 feedback loop circuits. The first feedback loop circuit includes phase detector and sampler circuit 210, multiplexer circuits 202, loop filter circuit 204, oscillator circuit 206, and L1 counter circuit 207. The second feedback loop circuit in CDR 200 includes N counter circuit 211, PFD circuit 201, multiplexer circuits 202, loop filter circuit 204, oscillator circuit 206, L2 counter circuit 208, and M counter circuit 209. The second feedback loop circuit is a phase-locked loop (PLL) circuit.

The PLL circuit within CDR circuit 200 is now described during a frequency acquisition mode. During the frequency acquisition mode, the PLL in CDR circuit 200 adjusts the phase and frequency of a periodic feedback clock signal FBCLK to match the phase and frequency of a periodic clock signal RCKD.

A periodic reference clock signal REFCLK is provided to an input of N counter circuit 211. N counter circuit 211 functions as a frequency divider circuit in CDR circuit 200. N counter circuit 211 generates a periodic output clock signal RCKD in response to reference clock signal REFCLK. N counter circuit 211 divides the frequency of reference clock signal REFCLK by a positive integer frequency division value N to generate the frequency of clock signal RCKD. Clock signal RCKD is provided to an input of phase frequency detector circuit 201.

Phase frequency detector (PFD) circuit 201 compares the phase and the frequency of clock signal RCKD to the phase and the frequency of a feedback clock signal FBCLK to generate error signals UPPF and DNPF. Error signals UPPF and DNPF are indicative of the differences between the phases and the frequencies of clock signals RCKD and FBCLK.

Figure 1:
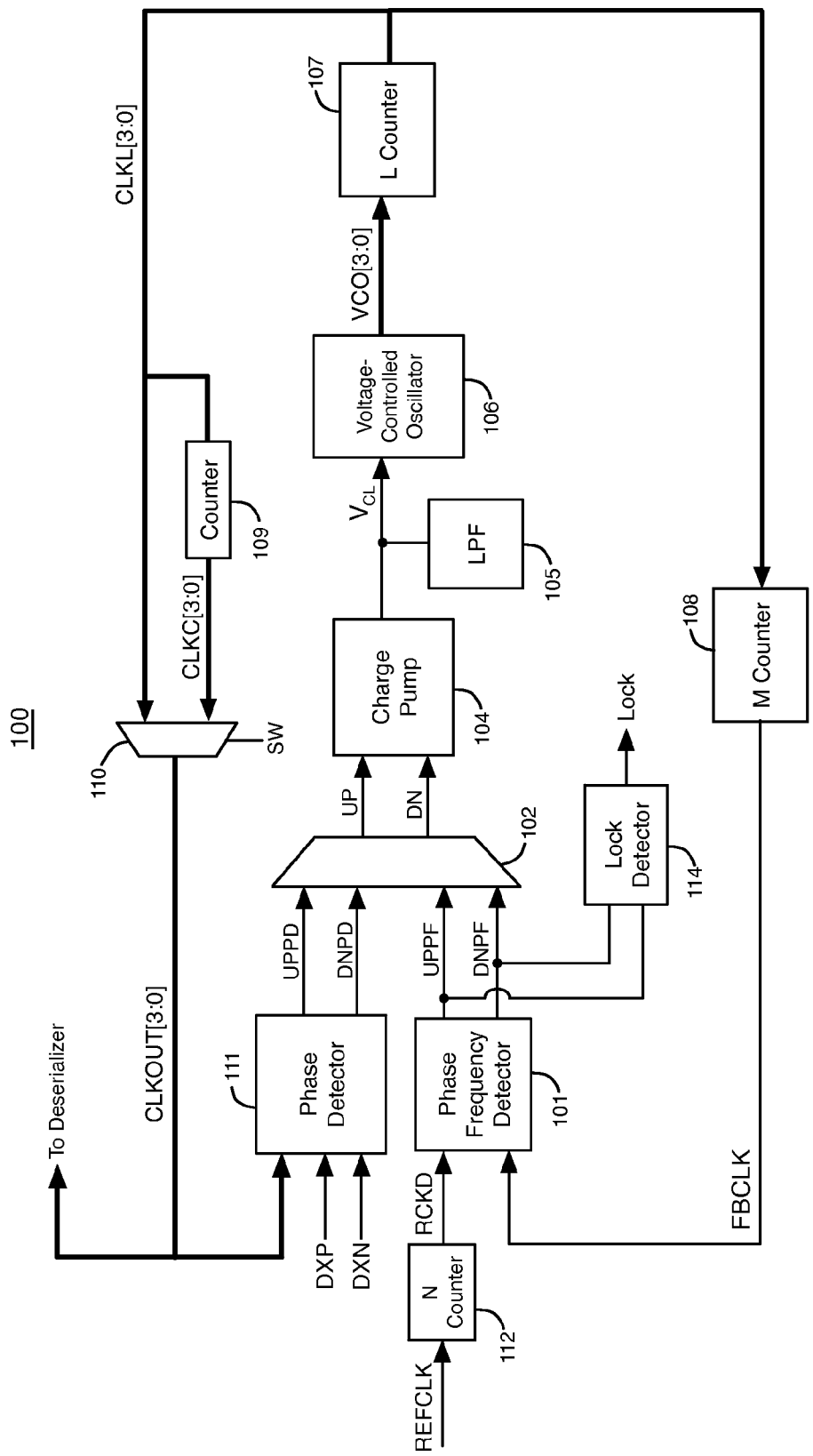
FIG. 1 illustrates an example of a prior art clock and data recovery (CDR) circuit that adjusts the frequencies of clock signals in response to a change in the data rate of a received data signal.

Multiplexers 202 include two 2-to-1 multiplexer circuits. During the frequency acquisition mode, multiplexers 202 are configured by select signal SL to provide error signals UPPF and DNPF to inputs of loop filter circuit 204 as error signals UP and DN, respectively. Loop filter circuit 204 converts the UP and DN error signals into a filtered control voltage signal $V_{CL}$. The control voltage signal $V_{CL}$ is provided to a control input of oscillator circuit 206. In one embodiment, loop filter circuit 204 includes a charge pump circuit that generates an analog control voltage $V_{CL}$ based on the UP and DN error signals and a low pass filter circuit that low pass filters the control voltage $V_{CL}$. In this embodiment, the charge pump and low pass filter are coupled together as shown in FIG. 1 for circuits 104-105. In another embodiment, loop filter circuit 204 is a digital loop filter circuit that generates one or more digital control signals $V_{CL}$.

Oscillator circuit 206 outputs 4 periodic output clock signals OSC[3:0]. Oscillator circuit 206 adjusts the phases and the frequencies of output clock signals OSC[3:0] based on changes in control voltage signal $V_{CL}$. The 4 output clock signals OSC[3:0] are transmitted to inputs of L1 counter circuit 207 and to inputs of L2 counter circuit 208. The 4 clock signals OSC[3:0] have relative phases of 0°, 90°, 180°, and 270°.

L2 counter circuit 208 generates 4 periodic output clock signals CLKL2[3:0] in response to the 4 clock signals OSC[3:0]. The 4 clock signals CLKL2[3:0] have relative phases of 0°, 90°, 180°, and 270°. L2 counter circuit 208 divides the frequencies of clock signals OSC[3:0] by a positive integer frequency division value L2 to generate the frequencies of clock signals CLKL2[3:0]. L2 counter circuit 208 functions as a frequency divider circuit in the sense that L2 counter circuit 208 reduces the frequencies of clock signals CLKL2[3:0] relative to the frequencies of clock signals OSC[3:0]. L2 counter circuit 208 functions as a frequency multiplier in the PLL in CDR circuit 200 in the sense that L2 counter circuit 208 causes the frequencies of clock signals OSC[3:0] to be larger than the frequency of clock signals CLKL2[3:0].

Clock signals CLKL2[3:0] are provided to inputs of M counter circuit 209. M counter circuit 209 generates a feedback clock signal FBCLK in response to one or more of clock signals CLKL2[3:0]. M counter circuit 209 divides the frequency of one or more of the 4 clock signals CLKL2[3:0] by a positive integer frequency division value M to generate the frequency of feedback clock signal FBCLK. M counter circuit 209 functions as a frequency divider circuit in the sense that M counter circuit 209 reduces the frequency of clock signal FBCLK relative to the frequencies of clock signals CLKL2[3:0]. M counter circuit 209 functions as a frequency multiplier in the PLL in CDR circuit 200 in the sense that M counter circuit 209 causes the frequencies of the CLKL2[3:0] clock signals to be larger than the frequency of clock signal FBCLK. In some embodiments, counter circuits 208-209 are merged into a single frequency divider/frequency multiplier circuit within the PLL of CDR circuit 200.

The phase-locked loop (PLL) formed by PFD 201, multiplexers 202, loop filter 204, oscillator circuit 206, L2 counter 208, and M counter 209 adjusts the phase and the frequency of clock signal FBCLK to cause the frequency of clock signal FBCLK to equal the frequency of clock signal RCKD and to align the phase of FBCLK with the phase of RCKD in the frequency acquisition mode. Lock detector circuit 214 asserts the LOCK signal in response to error signals UPPF and DNPF indicating that clock signals RCKD and FBCLK are aligned in phase and have the same frequency. When the LOCK signal is asserted, the PLL in CDR circuit 200 is in a lock state. In a half-rate embodiment of CDR circuit 200, the frequency of clock signals OSC[3:0] is one-half the data rate of data signal DXP/DXN when the PLL in CDR circuit 200 is in the lock state.

L1 counter circuit 207 generates 4 periodic output clock signals CLKL1[3:0] in response to the 4 output clock signals OSC[3:0] of oscillator circuit 206. L1 counter circuit 207 divides the frequencies of clock signals OSC[3:0] by a positive integer frequency division value L1 to generate the frequencies of clock signals CLKL1[3:0]. The 4 clock signals CLKL1[3:0] have relative phases of 0°, 90°, 180°, and 270°.

Circuit 210 includes a phase detector circuit and a sampler circuit. Clock signals CLKL1[3:0] are provided to inputs of the phase detector and sampler circuits in circuit 210. Input signals DXP and DXN are provided to additional inputs of the phase detector and sampler circuits in circuit 210. Input signals DXP and DXN are a differential data signal DXP/DXN.

Figure 2B:
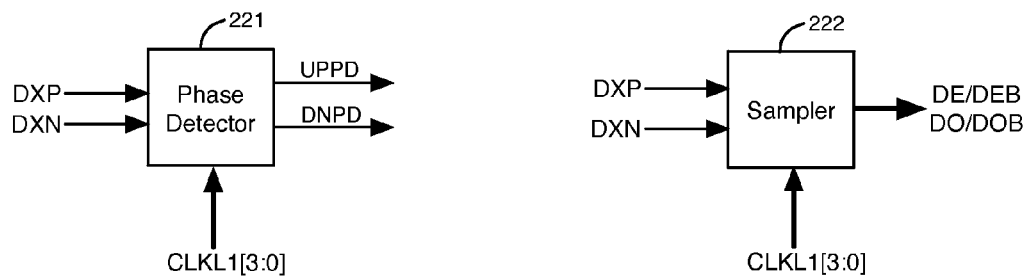
FIG. 2B illustrates an example of the phase detector and sampler circuit shown in FIG. 2A, according to an embodiment of the present invention.

FIG. 2B illustrates an example of phase detector and sampler circuit 210, according to an embodiment of the present invention. As shown in FIG. 2B, circuit 210 includes a phase detector circuit 221 and a sampler circuit 222. Phase detector circuit 221 in circuit 210 compares the phases of clock signals CLKL1[3:0] to the phase of the differential input data signal DXP/DXN to generate phase error signals UPPD and DNPD. Phase error signals UPPD and DNPD are indicative of the differences between the phase of the differential input data signal DXP/DXN and the phases of clock signals CLKL1[3:0].

Phase error signals UPPD and DNPD are transmitted to inputs of multiplexers 202. After lock detector circuit 214 asserts the LOCK signal indicating the PLL is in the lock state, CDR circuit 200 enters a data mode, and multiplexers 202 are reconfigured by select signal SL to provide the phase error signals UPPD and DNPD from phase detector 221 to inputs of loop filter 204 as error signals UP and DN, respectively. Select signal SL controls whether CDR circuit 200 is in the frequency acquisition mode or in the data mode. In the data mode, CDR circuit 200 adjusts the phases of output clock signals CLKL1[3:0] to match any changes in the phase of input data signal DXP/DXN. The 4 output clock signals CLKL1[3:0] of CDR circuit 200 are provided to inputs of deserializer circuit 216.

Referring again to FIG. 2B, sampler circuit 222 in circuit 210 samples the differential input data signal DXP/DXN in response to one or more of clock signals CLKL1[3:0] to generate differential even sampled data signals DE and DEB and differential odd sampled data signals DO and DOB. The DE and DO signals include data bits that are sampled in even and odd bit periods, respectively, of data signal DXP/DXN using one or more of clock signals CLKL1[3:0]. Sampled data signals DE and DEB are complementary signals, and sampled data signals DO and DOB are complementary signals. The sampled data signals DE, DEB, DO, and DOB are provided to 4 inputs of deserializer circuit 216, as shown in FIG. 2A. Deserializer circuit 216 converts the serial sampled data bits in signals DE, DEB, DO, and DOB into parallel sampled data bits using one or more of clock signals CLKL1 [3:0]. Deserializer 216 outputs the parallel sampled data bits in 40 parallel output data signals DATA[39:0], in the example of FIG. 2A. Deserializer 216 also generates a receiver clock signal CLKRX based on one or more of the output clock signals CLKL1[3:0] of CDR circuit 200, as described in more detail below with respect to FIG. 5.

CDR circuit 200 adjusts the frequency of the output clock signals CLKL1[3:0] between three or more different frequencies based on changes in the data rate of the differential input data signal DXP/DXN. Each of the three or more frequencies of clock signals CLKL1[3:0] corresponds to one of three or more data rates of the differential input data signal DXP/DXN. CDR circuit 200 adjusts the frequencies of the clock signals CLKL1[3:0] to correspond to the current data rate of the differential input data signal DXP/DXN. As a result, the sampler circuit 222 in circuit 210 samples the correct values in the differential input data signal DXP/DXN when the differential input data signal DXP/DXN has each of the three or more data rates.

Counter circuits 207, 208, 209, and 211 have adjustable frequency division values L1, L2, M, and N, respectively. CDR circuit 200 adjusts the frequency of the output clock signals CLKL1[3:0] by changing the frequency division values of one or more of counter circuits 207, 208, and 209. Table 1 below illustrates examples of the frequency division values L1, L2, M, and N of counter circuits 207, 208, 209, and 211, respectively, that generate three frequencies in the output clock signals CLKL1[3:0] corresponding to three exemplary data rates of 2.5 Gbps, 5.0 Gbps, and 8.0 Gbps in the differential input data signal DXP/DXN.

TABLE 1

| Data Rate (Gbps) | REFCLK (MHz) | N | M | L2 | L1 | OSC [3:0] (MHz) | CLKL1 [3:0] (MHz) | CLKL2 [3:0] (MHz) |
| --- | --- | --- | --- | --- | --- | --- | --- | --- |
| 2.5 | 100 | 1 | 25 | 1 | 2 | 2500 | 1250 | 2500 |
| 5.0 | 100 | 1 | 25 | 1 | 1 | 2500 | 2500 | 2500 |
| 8.0 | 100 | 1 | 40 | 1 | 1 | 4000 | 4000 | 4000 |

In the examples shown in Table 1, CDR circuit 200 generates frequencies of 1250 MHZ, 2500 MHz, and 4000 MHz in the output clock signals CLKL1[3:0] that are used to sample data being transmitted at data rates of 2.5 Gbps, 5.0 Gbps. and 8.0 Gbps, according to the PCI-E 1.0, 2.0, and 3.0 standards, respectively. According to other embodiments, CDR circuit 200 generates other frequencies of the output clock signals CLKL1[3:0] that are used to sample data being transmitted at different data rates supported by different data transmission protocols.

Finite state machine (FSM) circuit 215 generates control signals CL1, CL2, and CM that control the frequency division values L1, L2, and M of counter circuits 207, 208, and 209, respectively. The control signals CL1, CL2, and CM are provided to inputs of counter circuits 207, 208, and 209, respectively, as shown in FIG. 2A. FSM 215 varies the logic states of control signals CL1, CL2, and CM to adjust the frequency division values L1, L2, and M of counter circuits 207, 208, and 209, respectively. FSM 215 can, for example, be implemented in hardwired logic circuitry or in programmable logic circuitry.

Each of the frequency division values L1, L2, and M of counter circuits 207-209, respectively, can be set to one of 2, 3, 4, 5, 6, 7, 8, or more possible values. As examples that are not intended to be limiting, each of the frequency division values L1 and L2 of counter circuits 207-208, respectively, can be set to equal one of the integer values 1, 2, 4, or 8, and the frequency division value M of counter circuit 209 can be set to one of the integer values 1, 4, 5, 8, 10, 16, 20, 25, and 40.

FSM 215 selects the frequency division values L1, L2, and M based on control signals SW0 and SW1, based on the LOCK signal generated by lock detector circuit 214, and based on a periodic clock signal FSMCLK. FSM 215 varies one or more of the frequency division values L1, L2, and M by varying respective sets of the control signals CL1, CL2, and CM based on changes in one or more of signals SW0, SW1, and LOCK.

Control signals SW0-SW1 are set to three or more unique combinations of logic states. Each unique combination of the logic states of control signals SW0-SW1 corresponds to a different data rate of the differential input data signal DXP/DXN generated according to a different data transmission protocol. Changes are made to the logic state combinations of control signals SW0-SW1 to cause CDR circuit 200 to change the frequencies of clock signals CLKL1[3:0] based on a change in the data rate of the differential input data signal DXP/DXN according to a different data transmission protocol.

Control signals SW0-SW1 are asynchronous with respect to the clock signal FSMCLK of FSM 215. The conductors that provide control signals SW0-SW1 to FSM 215 may have routing delay skew relative to each other. If changes in the logic states of control signals SW0-SW1 that are intended to occur concurrently arrive at FSM 215 at different times, FSM 215 may cause CDR circuit 200 to generate incorrect frequencies in clock signals CLKL1[3:0] that do not correspond to the data rate of the differential input data signal DXP/DXN.

Figure 3:
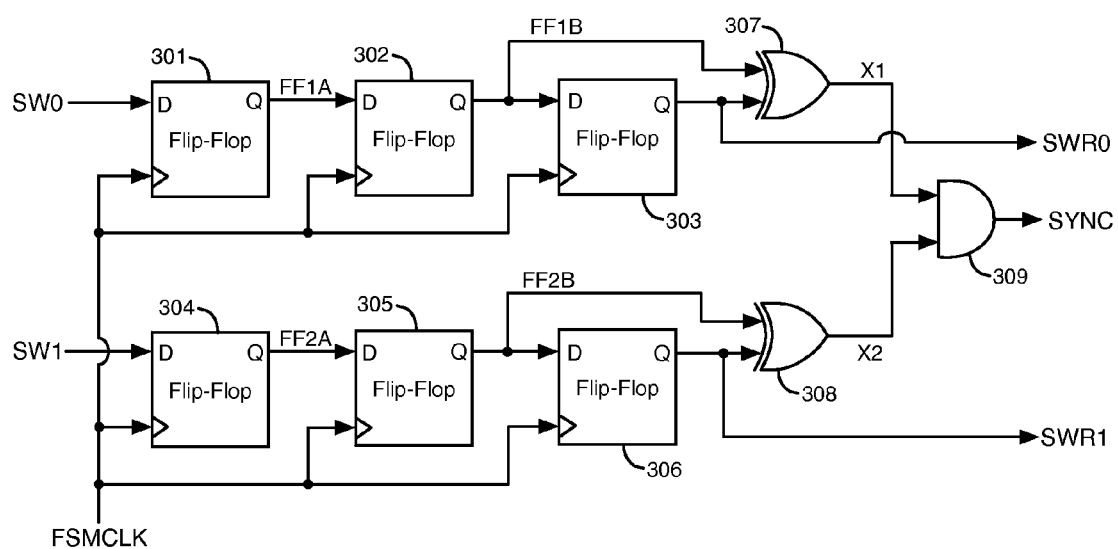
FIG. 3 illustrates an example of a synchronization circuit in the finite state machine (FSM) shown in FIG. 2A, according to an embodiment of the present invention.

FIG. 3 illustrates an example of a synchronization circuit 300 in finite state machine (FSM) 215, according to an embodiment of the present invention. Synchronization circuit 300 synchronizes control signals SW0-SW1 using clock signal FSMCLK. Synchronization circuit 300 asserts a synchronization signal SYNC in response to each of the control signals SW0-SW1 maintaining a constant logic state for at least one period of clock signal FSMCLK. FSM 215 only adjusts the frequencies of clock signals CLKL1[3:0] when the SYNC signal is asserted so that CDR circuit 200 does not generate frequencies in clock signals CLKL1[3:0] that do not correspond to the data rate of the differential input data signal DXP/DXN.

Synchronization circuit 300 includes D flip-flop storage circuits 301-306, XNOR logic gates 307-308, and an AND logic gate 309. Flip-flops 301-306 synchronize control signals SW0-SW1 to clock signal FSMCLK. Control signals SW0 and SW1 are provided to the D inputs of flip-flops 301 and 304, respectively. Clock signal FSMCLK is provided to the clock inputs of flip-flops 301-306. Flip-flops 301 and 304 store the logic states of control signals SW0 and SW1 at their Q outputs as signals FF1A and FF2A, respectively, in response to each rising edge in clock signal FSMCLK. Flip-flops 302 and 305 store the logic states of signals FF1A and FF2A at their Q outputs as signals FF1B and FF2B, respectively, in response to each rising edge in clock signal FSMCLK. Flip-flops 303 and 306 store the logic states of signals FF1B and FF2B at their Q outputs as signals SWR0 and SWR1, respectively, in response to each rising edge in clock signal FSMCLK. Signals SWR0 and SWR1 are also referred to herein as signals SWR[1:0].

XNOR logic gate 307 generates logic signal X1 by performing an XNOR Boolean function on input signals FF1B and SWR0. XNOR logic gate 308 generates logic signal X2 by performing an XNOR Boolean function on input signals FF2B and SWR1. AND logic gate 309 generates the synchronization signal SYNC by performing a Boolean AND function on input signals X1 and X2.

XNOR logic gate 307 only generates a logic high state in signal X1 when signals FF1B and SWR0 are in the same logic state. XNOR logic gate 308 only generates a logic high state in signal X2 when signals FF2B and SWR1 are in the same logic state. AND gate 309 generates a logic high state in the SYNC signal only when both of signals X1 and X2 are concurrently in logic high states.

FSM 215 only causes changes in the frequencies of clock signals CLKL1[3:0] based on a change in the logic state of one or more of signals SWR0-SWR1 when the SYNC signal is in a logic high state. FSM 215 does not cause changes in the frequencies of clock signals CLKL1[3:0] based on changes in control signals SW0-SW1 that fail to propagate through circuit 300 to signals SWR0-SWR1, respectively. FSM 215 does not cause changes in the frequencies of clock signals CLKL1[3:0] when the SYNC signal is in a logic low state. FSM 215 sets the frequencies of clock signals CLKL1[3:0] based on the logic states of signals SWR0-SWR1 when the SYNC signal is in a logic high state.

Figure 4:
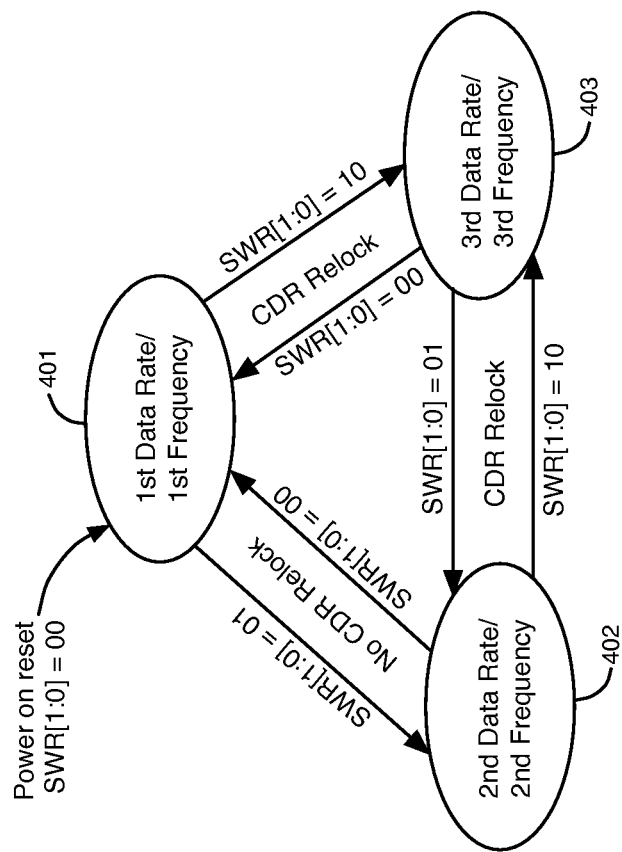
FIG. 4 shows a state diagram illustrating three different states of the finite state machine shown in FIG. 2A, according to an embodiment of the present invention.

FIG. 4 shows a state diagram illustrating three different states 401-403 of the finite state machine 215, according to an embodiment of the present invention. FSM 215 causes CDR circuit 200 to generate a first frequency for each of clock signals CLKL1[3:0] in state 401 when the differential input data signal DXP/DXN has a first data rate based on a first data transmission protocol. FSM 215 causes CDR circuit 200 to generate a second frequency for each of clock signals CLKL1[3:0] in state 402 when the differential input data signal DXP/DXN has a second data rate based on a second data transmission protocol. FSM 215 causes CDR circuit 200 to generate a third frequency for each of clock signals CLKL1[3:0] in state 403 when the differential input data signal DXP/DXN has a third data rate based on a third data transmission protocol.

The logic states of signals SWR[1:0] determine which of the three states FSM 215 is in. After power on reset (POR), signals SWR0 and SWR1 have logic states of 0 and 0, respectively (i.e., SWR[1:0]=00), and FSM enters state 401. The SWR[1:0] signals are set to logic states that cause FSM 215 to be in state 401 when the differential input data signal DXP/DXN has the first data rate. In state 401, FSM 215 generates the first frequency for each of the output clock signals CLKL1[3:0]. As an example, CDR circuit 200 generates frequencies of 1250 MHz in output clock signals CLKL1[3:0] when FSM 215 is in state 401 and the data rate of the different input data signal DXP/DXN is 2.5 Gbps, as shown in Table 1.

When the logic states of signals SWR0 and SWR1 are 1 and 0, respectively (i.e., SWR[1:0]=01), FSM 215 is in state 402. The SWR[1:0] signals are set to logic states that cause FSM 215 to be in state 402 when the differential input data signal DXP/DXN has the second data rate. In state 402, FSM 215 generates the second frequency for each of the output clock signals CLKL1[3:0]. As an example, CDR circuit 200 generates frequencies of 2500 MHz in output clock signals CLKL1[3:0] when FSM 215 is in state 402 and the data rate of the different input data signal DXP/DXN is 5.0 Gbps, as shown in Table 1.

When the logic states of signals SWR0 and SWR1 are 0 and 1, respectively (i.e., SWR[1:0]=10), FSM 215 is in state 403. The SWR[1:0] signals are set to logic states that cause FSM 215 to be in state 403 when the differential input data signal DXP/DXN has the third data rate. In state 403, FSM 215 generates the third frequency for each of the output clock signals CLKL1[3:0]. As an example, CDR circuit 200 generates frequencies of 4000 MHz in output clock signals CLKL1[3:0] when FSM 215 is in state 403 and the data rate of the different input data signal DXP/DXN is 8.0 Gbps, as shown in Table 1.

FSM 215 changes from state 401 to state 402 in response to the logic states of the SWR[1:0] signals changing from 00 to 01, as shown in FIG. 4. After FSM 215 changes from state 401 to state 402, FSM 215 adjusts the frequency division value L1 of counter 207 to cause CDR circuit 200 to produce the second frequencies of the clock signals CLKL1[3:0] corresponding to state 402. As an example, FSM 215 changes the logic states of the control signals CL1 to cause the frequency division value L1 of counter circuit 207 to change from 2 to 1 causing the frequencies of clock signals CLKL1[3:0] to increase from 1250 MHz to 2500 MHz, as shown in Table 1.

FSM 215 changes from state 402 to state 401 in response to the logic states of the SWR[1:0] signals changing from 01 to 00. FSM 215 adjusts the frequency division value L1 of counter 207 to cause CDR circuit 200 to produce the first frequencies of the clock signals CLKL1[3:0] that correspond to state 401.

FSM 215 changes from state 401 to state 403 in response to the logic states of the SWR[1:0] signals changing from 00 to 10, as shown in FIG. 4. After FSM 215 changes from state 401 to state 403, FSM 215 adjusts the frequency division values of one or more of counter circuits 207-209 to cause CDR circuit 200 to produce the third frequencies of the clock signals CLKL1[3:0] corresponding to state 403. As an example, FSM 215 changes the logic states of the control signals CL1 and CM to cause the frequency division value L1 of counter circuit 207 to change from 2 to 1 and the frequency division value M of counter circuit 209 to change from 25 to 40 causing the frequencies of clock signals CLKL1[3:0] to increase from 1250 MHz to 4000 MHz, as shown in Table 1. As another example, FSM 215 changes the logic states of the control signals CL1, CL2, and CM to cause the frequency division values L1, L2, and M of counter circuits 207-209 to change from 2, 1, and 25 to 1, 2, and 20, respectively, to increase the frequencies of clock signals CLKL1[3:0] from 1250 MHz to 4000 MHz.

FSM 215 changes from state 403 to state 401 in response to the logic states of the SWR[1:0] signals changing from 10 to 00. FSM 215 adjusts the frequency division values of one or more of counter circuits 207-209 to cause CDR circuit 200 to produce the first frequencies of the clock signals CLKL1[3:0] that correspond to state 401.

FSM 215 changes from state 402 to state 403 in response to the logic states of the SWR[1:0] signals changing from 01 to 10, as shown in FIG. 4. After FSM 215 changes from state 402 to state 403, FSM 215 adjusts the frequency division value of one or more of counter circuits 207-209 to cause CDR circuit 200 to produce the third frequencies of the clock signals CLKL1[3:0] that correspond to state 403. As an example, FSM 215 changes the logic states of the control signals CM to cause the frequency division value M of counter circuit 209 to change from 25 to 40, causing the frequencies of clock signals CLKL1[3:0] to increase from 2500 MHz to 4000 MHz, as shown in Table 1. As another example, FSM 215 changes the logic states of control signals CL2 and CM to cause the frequency division values L1, L2, and M of counter circuits 207-209 to change from 1, 1, and 25 to 1, 2, and 20, respectively, to increase clock signals CLKL1[3:0] from 2500 MHz to 4000 MHz.

FSM 215 changes from state 403 to state 402 in response to the logic states of the SWR[1:0] signals changing from 10 to 01. FSM 215 adjusts the frequency division value of one or more of counter circuits 207-209 to cause CDR circuit 200 to produce the second frequencies of the clock signals CLKL1[3:0] that correspond to state 402.

Because CDR circuit 200 does not change the frequency division values N, M, and L2 of the counter circuits 208, 209, and 211, respectively, when changing between states 401 and 402, the PLL in CDR circuit 200 remains in the lock state during transitions between states 401 and 402. However, the PLL in CDR circuit 200 goes out of the lock state when entering into or exiting out of state 403, because one or both of the frequency division values M and L2 change when entering into or exiting out of state 403.

Deserializer circuit 216 blocks the output clock signal CLKRX during each transition that CDR circuit 200 makes between one of states 401-403 and a different one of states 401-403 to prevent glitches in clock signal CLKRX. Glitches in clock signal CLKRX may cause errors in circuitry (not shown) that is responsive to clock signal CLKRX.

Figure 5:
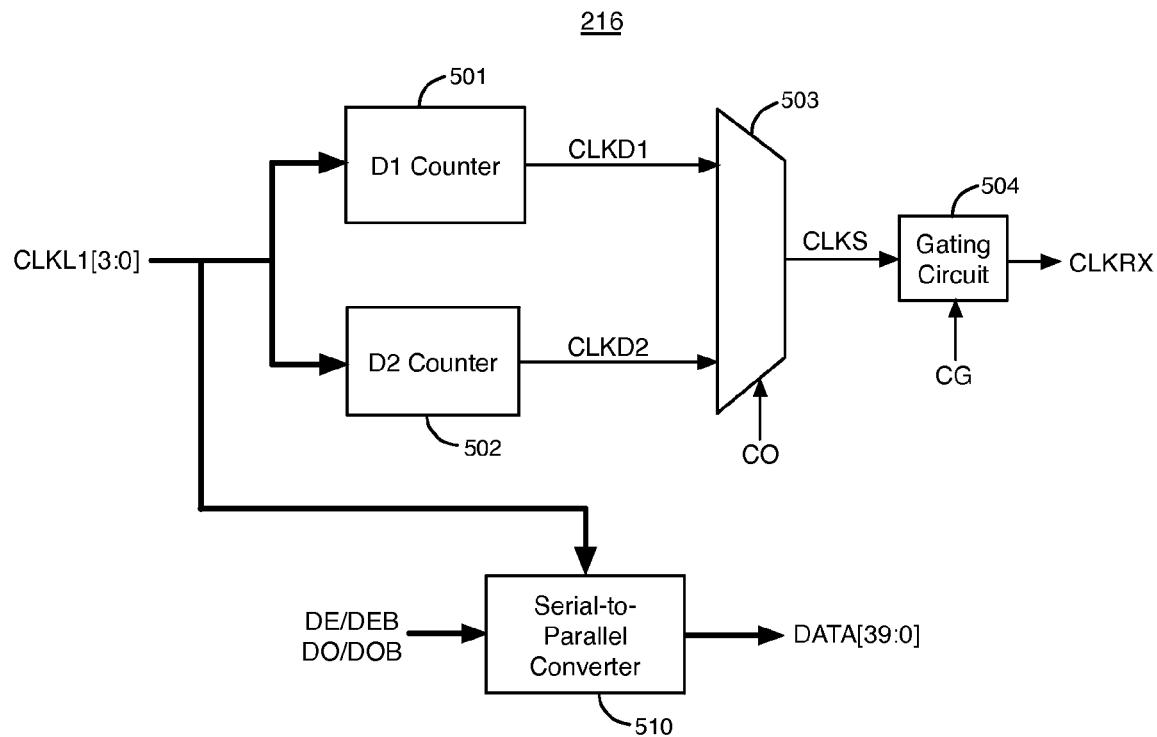
FIG. 5 illustrates an example of the deserializer circuit shown in FIG. 2A, according to an embodiment of the present invention.

FIG. 5 illustrates an example of deserializer circuit 216, according to an embodiment of the present invention. Deserializer circuit 216 includes two counter circuits 501-502, multiplexer circuit 503, gating circuit 504, and serial-to-parallel converter circuit 510. Output clock signals CLKL1[3:0] and sampled data signals DE, DEB, DO, and DOB are provided to inputs of serial-to-parallel converter circuit 510. Sampled data signals DE, DEB, DO, and DOB each have serial streams of sampled data bits. Serial-to-parallel converter circuit 510 converts sampled data signals DE, DEB, DO, and DOB into 40 parallel output data signals DATA[39:0] that each have sampled bits in response to clock signals CLKL1[3:0].

The output clock signals CLKL1[3:0] of CDR circuit 200 are provided to inputs of each of counter circuits 501-502. Counter circuits 501-502 function as frequency divider circuits. Counter circuit 501 divides the frequencies of 2 of output clock signals CLKL1[3:0] by a first frequency division value D1 (e.g., 5) to generate a first output clock signal CLKD1. Counter circuit 502 divides the frequencies of 2 of output clock signals CLKL1[3:0] by a second frequency division value D2 (e.g., 16) to generate a second output clock signal CLKD2. Clock signals CLKD1-CLKD2 are provided to inputs of multiplexer circuit 503.

FSM 215 generates a select signal CO that is provided to a select input of multiplexer circuit 503. The logic state of the select signal CO determines whether multiplexer circuit 503 provides clock signal CLKD1 or clock signal CLKD2 to its output as selected clock signal CLKS. When FSM 215 is in either of states 401 and 402, FSM 215 generates a logic state in select signal CO that causes multiplexer 503 to provide clock signal CLKD1 to its output as selected clock signal CLKS. When FSM 215 is in state 403, FSM 215 generates a logic state in select signal CO that causes multiplexer 503 to provide clock signal CLKD2 to its output as selected clock signal CLKS. Thus, the frequency divided clock signal CLKD1 is used as clock signal CLKS in states 401 and 402, and the frequency divided clock signal CLKD2 is used as clock signal CLKS in state 403.

FSM 215 generates a gating control signal CG that is provided to a control input of gating circuit 504. The selected clock signal CLKS is provided to an input of gating circuit 504. Gating circuit 504 provides selected clock signal CLKS to its output as receiver output clock signal CLKRX in response to gating control signal CG having a first logic state. Gating circuit 504 prevents the selected clock signal CLKS from being provided to its output as clock signal CLKRX in response to gating control signal CG having a second logic state. Clock signal CLKRX remains in a logic low state while the gating control signal CG is in the second logic state.

FSM 215 causes gating circuit 504 to block the selected clock signal CLKS from being provided to the output of gating circuit 504 as clock signal CLKRX whenever the data rate of the input data signal DXP/DXN changes. Gating circuit 504 blocks clock signal CLKS from propagating to its output as clock signal CLKRX and causes clock signal CLKRX to be in a logic low state during each transition in FSM 215 between one of states 401-403 and another one of states 401-403.

As mentioned above, the PLL in CDR circuit 200 remains in the lock state during transitions between states 401 and 402. When CDR circuit 200 changes between states 401 and 402, FSM 215 generates the second logic state in the CG signal to block the selected clock signal CLKS from being provided to the output of gating circuit 504 as clock signal CLKRX for a period of time. As a result, CDR circuit 200 and deserializer circuit 216 prevent any glitches in clock signal CLKS from propagating to clock signal CLKRX during transitions between states 401 and 402. As an example that is not intended to be limiting, FSM 215 may cause the CG signal to remain in the second logic state for 2-4 cycles of clock signal CLKS during each transition between states 401 and 402. Subsequently, FSM 215 causes the CG signal to return to the first logic state, and gating circuit 504 provides clock signal CLKS to its output as clock signal CLKRX.

CDR circuit 200 changes the frequency division values of one or both of counters 208-209 in the PLL when changing between states 401 and 403. CDR circuit 200 changes the frequency division values of one or both of counters 208-209 in the PLL when changing between states 402 and 403. The PLL in CDR circuit 200 exits the lock state when transitioning between states 401 and 403 and when transitioning between states 402 and 403, because at least one of the frequency division values of the counters 208-209 within the PLL changes when transitioning into or out of state 403. After the PLL in CDR circuit 200 exits the lock state, the PLL adjusts the frequency and phase of feedback clock signal FBCLK until the PLL reenters the lock state again, as described above. The process of the PLL in CDR circuit 200 exiting the lock state and then reentering the lock state is referred to as CDR relock herein and in FIG. 4. After the PLL reenters the lock state, lock detector 214 reasserts the LOCK signal.

When FSM 215 transitions into state 403 or out of state 403, FSM 215 generates the second logic state in the CG signal to block the selected clock signal CLKS from being provided to the output of gating circuit 504 as clock signal CLKRX for a period of time (for example, about 10 microseconds). During transitions into and out of state 403, gating circuit 504 maintains clock signal CLKRX in a logic low state, until the CG signal transitions back to the first logic state.

FSM 215 receives the LOCK signal from lock detector circuit 214. After FSM 215 exits or enters state 403, FSM 215 maintains the CG signal in the second logic state, until FSM 215 receives a rising edge in the LOCK signal. Lock detector circuit 214 generates a rising edge in the LOCK signal after the PLL in CDR circuit 200 reenters the lock state subsequent to FSM 215 exiting or entering state 403. In response to receiving the first rising edge in the LOCK signal that occurs after the CG signal transitions to the second logic state, FSM 215 causes the CG signal to transition back to the first logic state, causing gating circuit 504 to provide clock signal CLKS to its output as clock signal CLKRX. As a result, CDR circuit 200 and deserializer circuit 216 prevent glitches that occur in clock signal CLKS from propagating to clock signal CLKRX during transitions into and out of state 403.

Figure 6:
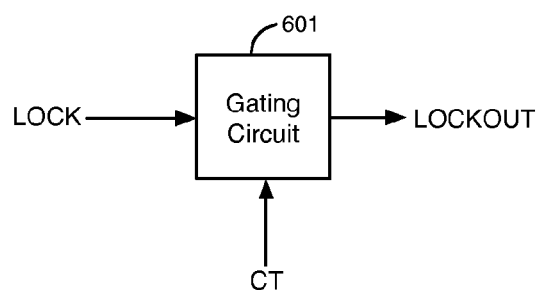
FIG. 6 illustrates an example of a gating circuit that controls a signal generated by the lock detection circuit shown in FIG. 2A, according to an embodiment of the present invention.

FIG. 6 illustrates an example of a gating circuit 601 that controls the LOCK signal, according to an embodiment of the present invention. FSM 215 in CDR circuit 200 generates an additional control signal CT. Control signal CT is provided to a control input of gating circuit 601. Gating circuits 504 and 601 can be, for example, tristate driver circuits or logic gates (e.g., AND gates). The LOCK signal is provided from the output of lock detector circuit 214 to an input of gating circuit 601.

Gating circuit 601 provides the LOCK signal to its output as an output signal LOCKOUT in response to control signal CT having a first logic state. Gating circuit 601 prevents rising and falling edges in the LOCK signal from being provided to the LOCKOUT signal in response to control signal CT having a second logic state. FSM 215 causes control signal CT to transition from the first logic state to the second logic state when FSM 215 transitions into or out of state 403. Thus, gating circuit 601 prevents glitches in the LOCK signal from propagating to the LOCKOUT signal when the frequencies of clock signals CLKL1[3:0] change to or from the third frequencies. The LOCKOUT signal remains in the same logic state while the control signal CT is in the second logic state. When FSM 215 detects a low-to-high transition in the LOCK signal after control signal CT transitions to the second logic state, FSM causes the CT signal to transition back to the first logic state.

The LOCKOUT signal is provided to other circuitry (not shown) on the same integrated circuit as CDR circuit 200. Gating circuit 601 prevents rising and falling edges in the LOCK signal from propagating to circuitry that receives the LOCKOUT signal during state transitions into and out of state 403. Glitches in the LOCKOUT signal may cause errors in circuitry that receives and responds to the LOCKOUT signal.

Figure 7:
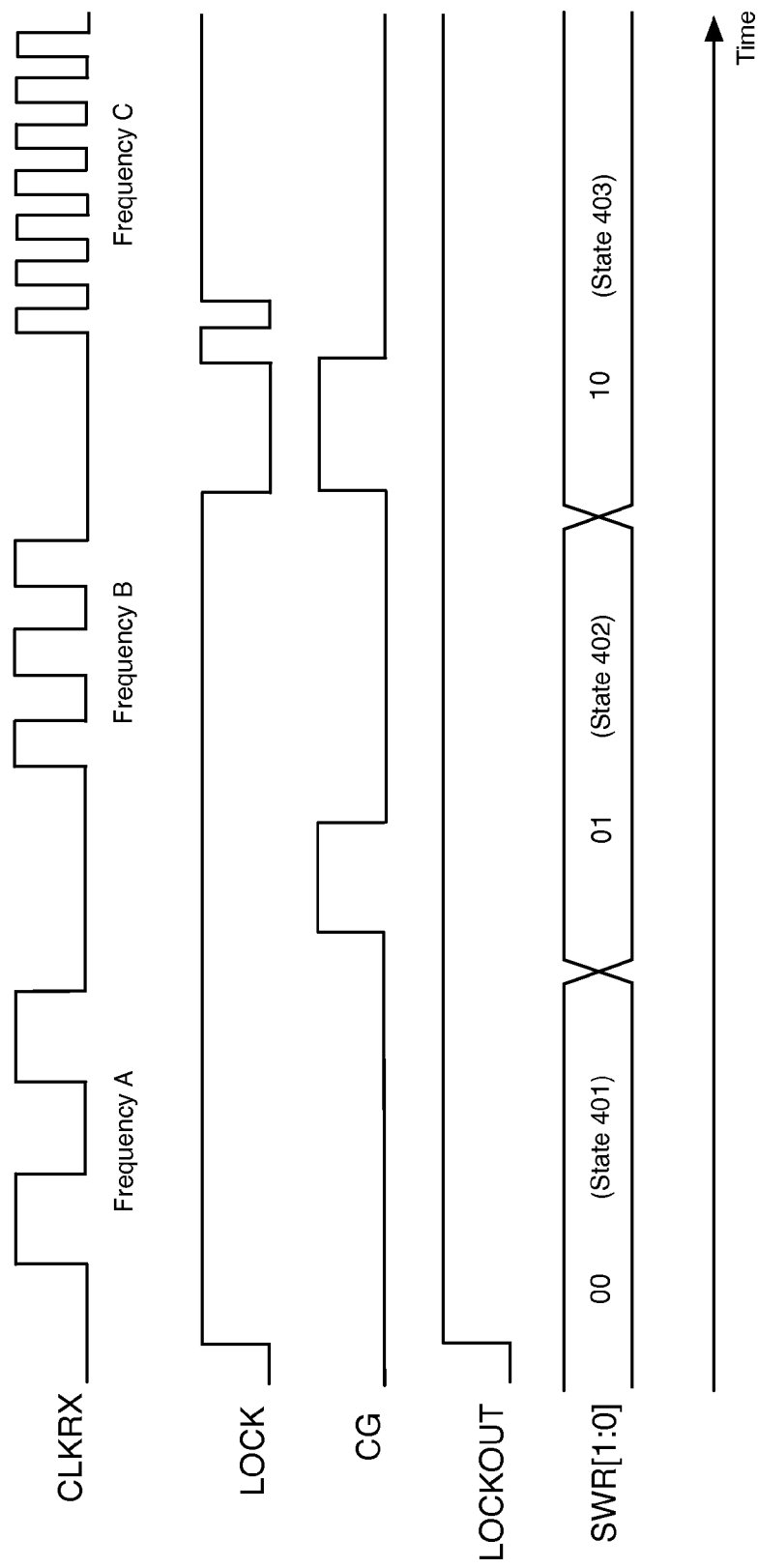
FIG. 7 is a timing diagram that illustrates examples of waveforms of some of the signals shown in FIG. 2A, according to an embodiment of the present invention.

FIG. 7 is a timing diagram that shows examples of waveforms of the output clock signal CLKRX, the LOCK signal, the CG control signal, the LOCKOUT signal, and control signals SWR[1:0], according to an embodiment of the present invention. In the example shown in FIG. 7, the output clock signal CLKRX has frequency A when signals SWR[1:0] have logic states 00 in state 401. In the example of FIG. 7, the first logic state of the CG signal is a logic low state, and the second logic state of the CG signal is a logic high state.

Referring to the timing diagram of FIG. 7, FSM 215 generates a logic high pulse in the CG signal during a transition from state 401 to state 402. Gating circuit 504 holds clock signal CLKRX in a logic low state during the logic high pulse in the CG signal. After a falling edge in the CG signal, clock signal CLKRX has frequency B during state 402. Signals SWR[1:0] have logic states 01 in state 402 in the example shown in FIG. 7.

During a transition from state 402 to state 403, FSM 215 generates a rising edge in the CG signal. Gating circuit 504 holds clock signal CLKRX in a logic low state while the CG signal is in a logic high state. FSM 215 maintains the CG signal in the logic high state until FSM 215 receives a rising edge in the LOCK signal from lock detector circuit 214. After FSM 215 receives a rising edge in the LOCK signal, FSM 215 generates a falling edge in the CG signal, as shown in FIG. 7. FSM 215 then maintains the CG signal in a logic low state until the next transition out of state 403 to state 401 or 402. Any subsequent rising and falling edges in the LOCK signal that occur during the same instance of state 403 do not cause FSM 215 to generate additional rising and falling edges in the CG signal, as shown in FIG. 7. After the falling edge in the CG signal, clock signal CLKRX has frequency C during state 403. Signals SWR[1:0] have logic states 10 in state 403 in the example shown in FIG. 7.

The LOCKOUT signal remains in a logic high state during and after each of the state transitions in the example shown in FIG. 7. Therefore, the circuitry that receives the LOCKOUT signal does not receive an indication that the PLL in CDR circuit 200 exits the lock state during the transition to state 403.

In alternative embodiments, CDR circuit 200 in FIG. 2A is configurable to function only as a phase-locked loop (PLL) in a PLL mode, and clock signals CLKL2[3:0] are provided to circuitry outside of CDR circuit 200 (e.g., a transmitter circuit).

Figure 8:
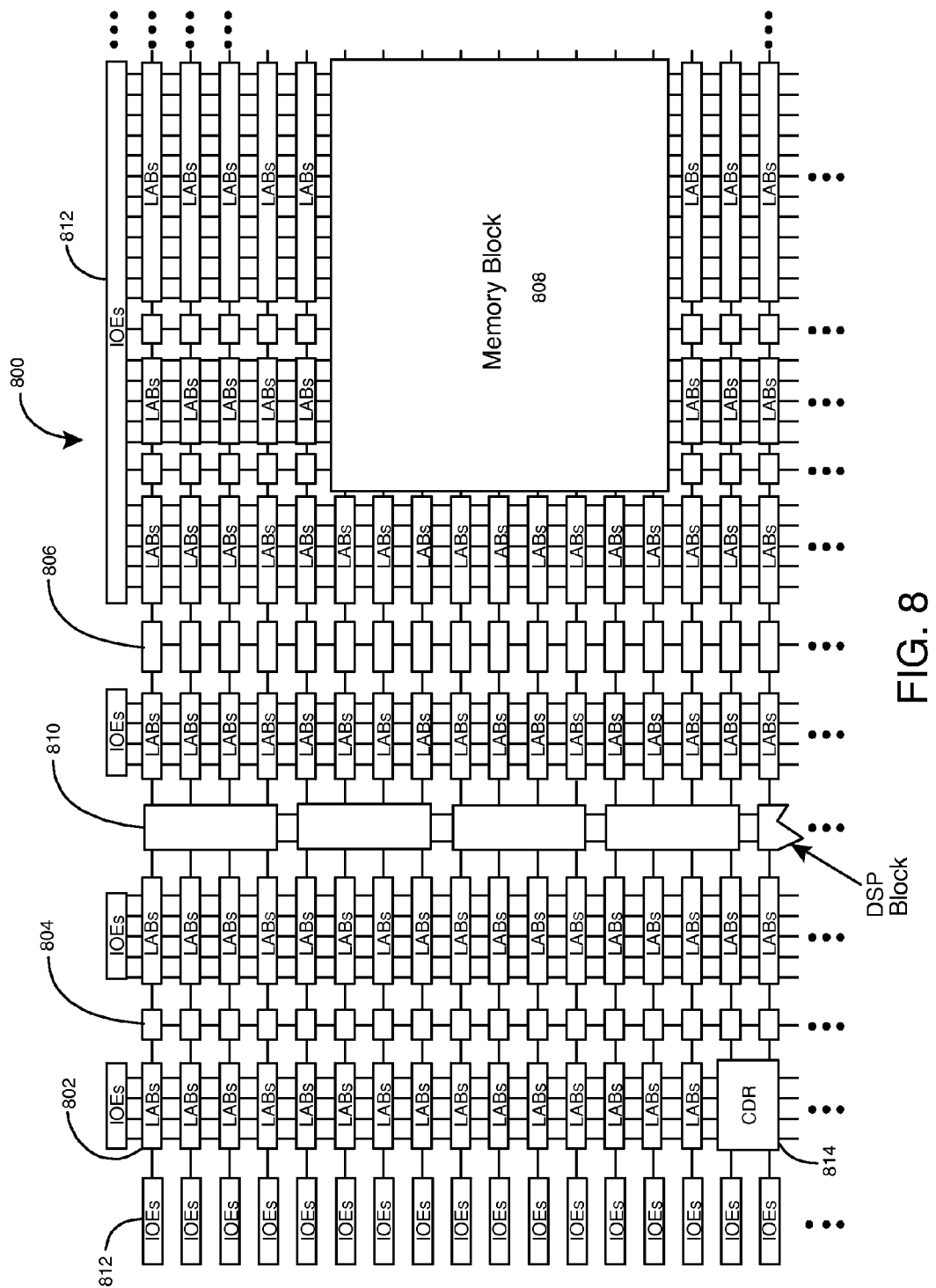
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be made in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. FPGA 800 also has a clock and data recovery (CDR) circuit 814, such as CDR circuit 200. It is to be understood that FPGA 800 is described herein for illustrative purposes only and that the present invention can be implemented in many different types of integrated circuits.

Figure 9:
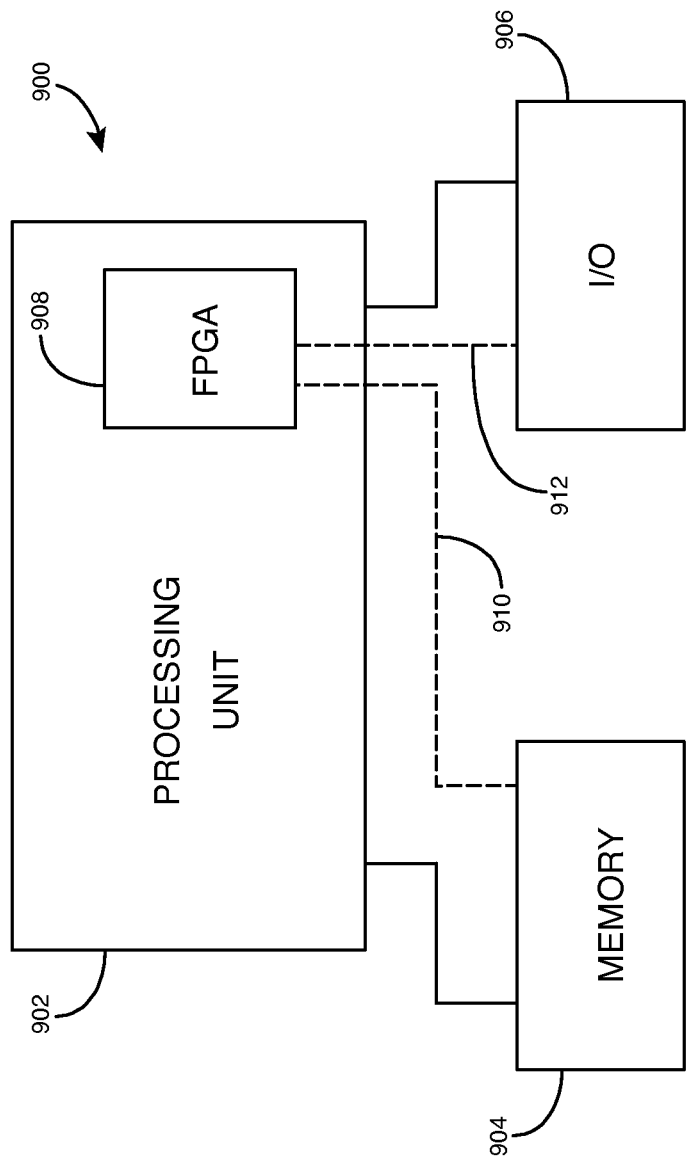
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a first phase detection circuit that compares a phase of a first periodic signal to a phase of a second periodic signal to generate a first control signal;
a phase adjustment circuit that causes the phase of the second periodic signal and a phase of a third periodic signal to vary based on a variation in the first control signal; and
a sampler circuit that samples a data signal to generate a sampled data signal in response to the third periodic signal, wherein the circuit varies a frequency of the third periodic signal to correspond to changes in a data rate of the data signal between at least three different data rates that are based on at least three data transmission protocols;
a first frequency divider circuit that generates the second periodic signal based on a fourth periodic signal;
a second frequency divider circuit that generates the third periodic signal based on a fifth periodic signal, wherein the phase adjustment circuit causes phases of the fourth and the fifth periodic signals to vary based on a change in the first control signal; and
a control circuit that varies frequency division values of the first and the second frequency divider circuits based on changes in the data rate of the data signal between the three different data rates.

2. The circuit of claim 1 further comprising:
a second phase detection circuit that compares phases of the data signal and the third periodic signal to generate a second control signal,
wherein the phase adjustment circuit causes phases of the second periodic signal and the third periodic signal to vary based on a change in the first control signal during a frequency acquisition mode, and wherein the phase adjustment circuit causes phases of the second periodic signal and the third periodic signal to vary based on a change in the second control signal during a data mode.

3. The circuit of claim 1 further comprising:
a third frequency divider circuit that generates the fourth periodic signal based on a sixth periodic signal, wherein the phase adjustment circuit outputs the fifth and the sixth periodic signals.

4. The circuit of claim 1 wherein the circuit is a clock and data recovery circuit.

5. A circuit comprising:
a first phase detection circuit that compares a phase of a first periodic signal to a phase of a second periodic signal to generate a first control signal;
a phase adjustment circuit that causes the phase of the second periodic signal and phase of a third periodic signal to vary based on a variation in the first control signal;
a sampler circuit that samples a data signal to generate a sampled data signal in response to the third periodic signal;
a lock detector circuit that receives the first control signal and that generates a lock signal indicating if phases of the first and the second periodic signals are aligned;
a control circuit that causes a frequency of the third periodic signal to vary based on changes in a data rate of the data signal, wherein the control circuit generates a second control signal based on the lock signal after the data rate of the data signal changes during a transition between two data transmission protocols; and
a gating circuit that generates a fourth periodic signal from the third periodic signal, wherein the gating circuit blocks the fourth periodic signal based on the second control signal.

6. The circuit of claim 2 further comprising:
a multiplexer circuit that receives the first and the second control signals and that outputs one of the first and the second control signals as a selected control signal; and
a loop filter circuit that generates a filtered control signal in response to the selected control signal, wherein the phase adjustment circuit causes phases of the second and the third periodic signals to vary based on changes in the filtered control signal.

7. The circuit of claim 1 further comprising:
a gating circuit that generates a sixth periodic signal from the third periodic signal, wherein the gating circuit blocks the sixth periodic signal based on a second control signal being asserted during a change in the data rate of the data signal between two different data rates corresponding to two of the data transmission protocols.

8. The circuit of claim 1 wherein the circuit is in a programmable logic integrated circuit.

9. The circuit of claim 1 wherein the phase adjustment circuit comprises an oscillator circuit.

10. The circuit of claim 1 further comprising:
a first storage circuit that stores a first stored signal in response to a sixth periodic signal;
a second storage circuit that stores a second stored signal based on the first stored signal in response to the sixth periodic signal;
a third storage circuit that stores a third stored signal in response to the sixth periodic signal;
a fourth storage circuit that stores a fourth stored signal based on the third stored signal in response to the sixth periodic signal; and
logic gate circuitry that asserts a second control signal in response to the first and the second stored signals having the same logic state for more than one period of the sixth periodic signal and in response to the third and the fourth stored signals having the same logic state for more than one period of the sixth periodic signal, wherein the circuit only varies the frequency of the third periodic signal to correspond to changes in the data rate of the data signal between the three different data rates in response to the second control signal being asserted.

11. A circuit comprising:
a first phase detection circuit that compares a phase of a first periodic signal to a phase of a second periodic signal to generate a first control signal;
a phase adjustment circuit that causes the phase of the second periodic signal and a phase of a third periodic signal to vary based on a change in the first control signal;
a sampler circuit that samples a data signal to generate a sampled data signal in response to the third periodic signal, wherein the circuit varies a frequency of the third periodic signal to correspond to changes in a data rate of the data signal; and
a gating circuit that generates a fourth periodic signal from the third periodic signal, wherein the gating circuit blocks the fourth periodic signal based on a second control signal being asserted in response to a change in the data rate of the data signal.

12. The circuit of claim 11 further comprising:
a first frequency divider circuit that generates the second periodic signal based on a fourth periodic signal;
a second frequency divider circuit that generates the third periodic signal based on a fifth periodic signal, wherein the phase adjustment circuit causes phases of the fourth and the fifth periodic signals to vary based on changes in the first control signal; and
a control circuit that varies frequency division values of the first and the second frequency divider circuits based on changes in the data rate of the data signal between at least three different data rates that correspond to at least three data transmission protocols.

13. The circuit of claim 12 further comprising:
a third frequency divider circuit that generates the fourth periodic signal based on a sixth periodic signal, wherein the phase adjustment circuit outputs the fifth and the sixth periodic signals.

14. The circuit of claim 11 wherein the circuit is a clock and data recovery circuit.

15. The circuit of claim 11 further comprising:
a lock detector circuit that receives the first control signal and generates a lock signal indicating if phases of the first and the second periodic signals are aligned; and
a control circuit that asserts the second control signal based on the lock signal and a third control signal indicating a change in the data rate of the data signal during a transition between two data transmission protocols.

16. The circuit of claim 11 wherein the circuit is part of a receiver circuit in an integrated circuit.

17. A circuit comprising:
a first phase detection circuit that compares a phase of a first periodic signal to a phase of a second periodic signal to generate a first control signal;
a phase adjustment circuit that causes the phase of the second periodic signal and a phase of a third periodic signal to vary based on a change in the first control signal;
a sampler circuit that samples a data signal to generate a sampled data signal in response to the third periodic signal; and
a logic circuit that asserts a second control signal in response to a third control signal having a constant state for more than one period of a fourth periodic signal and in response to a fourth control signal having a constant state for more than one period of the fourth periodic signal, wherein the circuit varies a frequency of the third periodic signal to correspond to changes in a data rate of the data signal in response to the second control signal being asserted.

18. The circuit of claim 17 further comprising:
a first storage circuit that stores a first stored signal in response to the fourth periodic signal;
a second storage circuit that stores a second stored signal based on the first stored signal in response to the fourth periodic signal;
a third storage circuit that stores a third stored signal in response to the fourth periodic signal; and
a fourth storage circuit that stores a fourth stored signal based on the third stored signal in response to the fourth periodic signal,
wherein the logic circuit asserts the second control signal in response to the first and the second stored signals having the same logic state for more than one period of the fourth periodic signal and in response to the third and the fourth stored signals having the same logic state for more than one period of the fourth periodic signal.

19. The circuit of claim 17 wherein the logic circuit comprises a first XNOR gate, a second XNOR gate, and an AND gate coupled to the first and the second XNOR gates.

20. The circuit of claim 18 further comprising:
a fifth storage circuit that stores a fifth stored signal based on the third control signal in response to the fourth periodic signal, wherein the fifth stored signal is provided to an input of the first storage circuit; and
a sixth storage circuit that stores a sixth stored signal based on the fourth control signal in response to the fourth periodic signal, wherein the sixth stored signal is provided to an input of the third storage circuit.

21. The circuit of claim 18 wherein the circuit varies the frequency of the third periodic signal to correspond to changes in the data rate of the data signal based on the second and the fourth stored signals in response to the second control signal being asserted.

22. The circuit of claim 17 further comprising:
   a first frequency divider circuit that generates the second periodic signal based on a fifth periodic signal;
   a second frequency divider circuit that generates the third periodic signal based on a sixth periodic signal, wherein the phase adjustment circuit causes phases of the fifth and the sixth periodic signals to vary based on changes in the first control signal; and
   a control circuit that varies frequency division values of the first and the second frequency divider circuits based on changes in the data rate of the data signal between at least three different data rates corresponding to at least three data transmission protocols.

23. The circuit of claim 22 further comprising:
   a third frequency divider circuit that generates the fifth periodic signal based on a seventh periodic signal.

24. A method comprising:
   comparing a phase of a first periodic signal to a phase of a second periodic signal to generate a first control signal;
   adjusting the phase of the second periodic signal and a phase of a third periodic signal based on a change in the first control signal;
   sampling a data signal to generate a sampled data signal in response to the third periodic signal;
   varying a frequency of the third periodic signal to correspond to changes in a data rate of the data signal between at least three different data rates, wherein each of the three different data rates of the data signal is based on a different data transmission protocol;
   dividing a frequency of a fourth periodic signal by a first frequency division value to generate a frequency of the second periodic signal;
   dividing a frequency of a fifth periodic signal by a second frequency division value to generate a frequency of the third periodic signal; and
   varying the first and the second frequency division values in response to the data signal varying between the three different data rates.

25. The method of claim 24 further comprising:
   comparing a phase of the data signal to the phase of the third periodic signal to generate a second control signal, wherein adjusting the phase of the second periodic signal and a phase of a third periodic signal based on a change in the first control signal further comprises adjusting the phases of the second and the third periodic signals based on changes in the first control signal during a frequency acquisition mode and adjusting the phases of the second and the third periodic signals based on a change in the second control signal during a data mode.

26. The method of claim 24 further comprising:
   dividing a frequency of a sixth periodic signal by a third frequency division value to generate a frequency of the fourth periodic signal.

27. A method comprising:
   comparing a phase of a first periodic signal to a phase of a second periodic signal to generate a first control signal;
   adjusting the phase of the second periodic signal and a phase of a third periodic signal based on a change in the first control signal;
   sampling a data signal to generate a sampled data signal in response to the third periodic signal;
   varying a frequency of the third periodic signal to correspond to changes in a data rate of the data signal;
   generating a lock signal indicating if the phases of the first and the second periodic signals are aligned based on the first control signal;
   generating a second control signal based on the lock signal after the data rate of the data signal changes during a transition between two different data rates of the data signal;
   generating a fourth periodic signal from the third periodic signal based on the second control signal; and
   preventing the fourth periodic signal from being generated using the third periodic signal based on the second control signal.

28. A method comprising:
   comparing a phase of a first periodic signal to a phase of a second periodic signal to generate a first control signal;
   adjusting the phase of the second periodic signal and a phase of a third periodic signal based on a change in the first control signal;
   sampling a data signal to generate a sampled data signal in response to the third periodic signal;
   asserting a second control signal in response to a third control signal having a constant state for more than one period of a fourth periodic signal and in response to a fourth control signal having a constant state for more than one period of the fourth periodic signal; and
   varying a frequency of the third periodic signal to correspond to changes in a data rate of the data signal when the second control signal is asserted.

29. The method of claim 28 further comprising:
   dividing a frequency of a fifth periodic signal by a first frequency division value to generate a frequency of the second periodic signal;
   dividing a frequency of a sixth periodic signal by a second frequency division value to generate a frequency of the third periodic signal; and
   varying the first and the second frequency division values in response to the data signal varying between different data rates.

30. The circuit of claim 5 further comprising:
   a first frequency divider circuit that generates the second periodic signal based on a fifth periodic signal; and
   a second frequency divider circuit that generates the third periodic signal based on a sixth periodic signal, wherein the phase adjustment circuit causes phases of the fifth and the sixth periodic signals to vary based on a change in the first control signal,
   wherein the control circuit varies frequency division values of the first and the second frequency divider circuits based on changes in the data rate of the data signal between three different data rates.

* * * * *